United States Patent [19]
Gross et al.

[11] Patent Number: 5,416,063
[45] Date of Patent: May 16, 1995

[54] METHOD OF PRODUCING A LAYER OF SUPERCONDUCTIVE OXIDE

[75] Inventors: Michal E. Gross, Summit; Catherine E. Rice, Scotch Plains, both of N.J.

[73] Assignee: AT&T Corp., Murray Hill, N.J.

[21] Appl. No.: 126,448

[22] Filed: Nov. 30, 1987

Related U.S. Application Data

[63] Continuation-in-part of Ser. No. 37,264, Apr. 10, 1987, abandoned.

[51] Int. Cl.$^6$ .......................... B05D 3/02; B05D 5/12
[52] U.S. Cl. .................................. 505/470; 505/734; 505/737; 505/434; 505/704; 427/62; 427/63; 427/126.3; 427/226
[58] Field of Search ............... 427/62, 63, 226, 126.3, 427/314; 505/1, 818, 819, 704, 734, 737, 470, 434

[56] References Cited

U.S. PATENT DOCUMENTS

| | | | |
|---|---|---|---|
| 2,763,569 | 9/1956 | Bradstreet et al. | 427/226 |
| 4,843,060 | 6/1989 | Lessott et al. | 505/1 |

FOREIGN PATENT DOCUMENTS 0125810 11/1984 European Pat. Off. .

OTHER PUBLICATIONS

Nasu et al "Superconducting Y-Ba-Cu-O Films with Tc>70K Prepared by thermal Decomposition technique of Y-, Ba-, and Cu-2 ethylhexanoates" Chemistry Letters pp. 2403-2404 Oct. 1987.
Meng et al "High Tc Superconducting Thin Films by Chemical Spray Deposition" International Journal of Modern Physics B. vol. 1 (2) Jun., 1987 pp. 579-582.
Kumagai et al "Preparation of Superconducting YBa$_2$Cu$_3$O$_{7-\delta}$ thin films by the Dipping-Pyrolysis Process Using Organic Acid Salts" Chem. Lett. Jun., 1987 p. 1645.
Kawai et al "Formation of Y-Ba-Cu-O Superconducting Films by a Spray Pyrolysis Method" Jpn. J. Appl. Phys. vol. 26(10) Oct. 1987 L1740-1742.
Hammond et al "Superconducting thin films of the Perovskite Superconductors by electron-beam Deposition" MRS, Apr., 1987 (Anaheim) pp. 169-171.
*Chemical Abstracts*, vol. 107, No. 20, Nov. 16, 1987, Columbus, Ohio.
*Zeitschr. f. Physik B—Condensed Matter*, vol. 64, (1986) by J. G. Bednorz and K. A. Muller, pp. 189-193.
*Physical Review Letters*, vol. 58(9), Mar. 2, 1987, pp. 908-910 "Superconductivity at 93K in a New Mixed-- Phase Y-Ba-Cu-O Compound System at Ambient Pressure" by M. K. Wu et al.

(List continued on next page.)

*Primary Examiner*—Roy V. King
*Attorney, Agent, or Firm*—Eugen E. Pacher; Glen E. Books

[57] ABSTRACT

Disclosed is a method for forming a superconductive oxide layer on a substrate. The method comprises applying a precursor solution to a major surface of the substrate such that a metal-containing layer is formed on the surface, and heat treating the substrate/layer combination such that at least a substantial portion of the layer material is transformed into superconductive oxide. Exemplarily, the precursor solution is formed by dissolving Ba—, Y—, and Cu-containing compounds in acetic acid and water, spinning the solution on a MgO substrate, driving of unwanted constituents of the resulting layer at 400° C., heating the combination to about 830° C. in O$_2$ such that the (perovskite) phase that is associated with superconductivity in YBa$_2$Cu$_3$O$_7$ is formed, and oxygenating the layer at about 400° C. in O$_2$.

7 Claims, 1 Drawing Sheet

OTHER PUBLICATIONS

Physical Review Letters, vol. 58(9), Mar. 2, 1987, pp. 911–912 "High-Pressure Study of the New Y–Ba–Cu–O Superconducting Compound System" by P. H. Hor et al.

Physical Review Letters, vol. 58(16), 20 Apr. 1987, pp. 1676–1679 "Bulk Superconductivity at 91K in Single-Phase Oxygen-Deficient Perovskite $Ba_2YCu_3O_{9-\delta}$" by R. J. Cava et al.

Superconductor Applications Squids and Machines, Plenum Press 1977, B. B. Schwartz and S. Foner, editors.

Superconductor Material Science, Metallurgy, Fabrications and Applications, Plenum Press 1981, by S. Foner and B. B. Schwartz, editors.

Physical Review Letters, vol. 58(18), pp. 1888–1890 4 May 1987 "New Superconducting Cuprate Perovskites" by D. W. Murphy et al.

Materials Research Society Proceedings, Symposium L: Defect Properties and Processing of High-Technology Nonmetallic Materials, Boston, Mass., Dec. 2–4, 1985, pp. 1–10.

Materials Research Society, Proceedings, Symposium G: Electronic Packaging Materials Science, Palo Alto, Calif., Apr. 5–17, 1986, pp. 1–6.

METHOD OF PRODUCING A LAYER OF SUPERCONDUCTIVE OXIDE

CROSS REFERENCE TO RELATED APPLICATION

This application is a continuation-in-part of U.S. patent application, Ser. No. 037,264, filed Apr. 10, 1987, now abandoned.

FIELD OF THE INVENTION

This invention pertains to methods for producing a thin layer of superconductive material on a substrate.

BACKGROUND OF THE INVENTION

From the discovery of superconductivity in 1911 to the recent past, essentially all known superconducting materials were elemental metals (e.g., Hg, the first known superconductor) or metal alloys (e.g., Nb$_3$Ge, probably the material with the highest transition temperature $T_c$ known prior to 1986).

Recently, superconductivity was discovered in a new class of materials, namely, metal oxides. See J. G. Bednorz and K. A. Muller, *Zeitschr. f. Physik B-Condensed Matter*, Vol. 64, 189 (1986), which reports superconductivity in lanthanum barium copper oxide.

The latter report stimulated worldwide research activity, which very quickly resulted in further significant progress. The progress has resulted, inter alia, to date in the discovery that compositions in the Y—Ba—Cu—O system can have superconductive transition temperatures $T_c$ above 77 K., the boiling temperature of liquid N$_2$ (see, for instance, M. K. Wu et al, *Physical Review Letters*, Vol. 58, Mar. 2, 1987, page 908; and P. H. Hor et al, ibid, page 911). Furthermore, it has resulted in the identification of the material phase that is responsible for the observed high temperature superconductivity, and in the discovery of composition and processing techniques that result in the formation of bulk samples of material that can be substantially single phase material and can have $T_c$ above 90 K. (see the U.S. patent application Ser. No. 024,046, entitled "Devices and Systems Based on Novel Superconducting Material," filed by B. J. Batlogg, R. J. Cava and R. B. van Dover on Mar. 10, 1987, co-assigned with this and incorporated herein by reference, which is a continuation-in-pan of an application filed by the same applicants on Mar. 3, 1987, which in turn is a continuation-in-part of application Ser. No. 001,682, filed by the same applicants on Jan. 9, 1987). See also R. J. Cava et al, *Physical Review Letters*, Vol. 58(16) pp. 1676–1679 (1987).

The excitement in the scientific and technical community that was created by the recent advances in superconductivity is at least in part due to the potentially immense technological impact of the availability of materials that are superconducting at temperatures that do not require refrigeration with expensive liquid He. Liquid nitrogen is generally considered to be perhaps the most advantageous cryogenic refrigerant, and attainment of superconductivity at liquid nitrogen temperature was a long-sought goal which until very recently appeared almost unreachable.

Although this goal has now been attained, there still exist barriers that have to be overcome before the new oxidic high $T_c$ superconductive materials can be utilized in many technological applications. In particular, techniques for forming high $T_c$ superconductive bodies of technologically significant shape have to be developed. Among the shapes of technological significance are thin layers, frequently patterned, on a non-superconducting substrate.

Prior art metallic superconductors have been prepared in thin layer form by such techniques as vapor deposition and sputtering. Such thin films have found use, for instance, in Josephson junctions and in various detectors.

For a general overview of some potential applications of superconductors see, for instance, B. B. Schwartz and S. Foner, editors, *Superconductor Applications: SQUIDS and MACHINES*, Plenum Press 1977; and S. Foner and B. B. Schwartz, editors, *Superconductor Material Science, Metallurgy, Fabrications, and Applications*, Plenum Press 1981. Among the applications are power transmission lines, rotating machinery, and superconductive magnets for e.g., fusion generators, MHD generators, particle accelerators, levitated vehicles, magnetic separation, and energy storage, as well as junction devices and detectors. It is expected that many of the above and other applications of superconductivity would materially benefit if high $T_c$ superconductive material could be used instead of the previously considered relatively low $T_c$ materials.

In particular, the existence of a method for producing thin layers of high $T_c$ superconductive oxide material would likely result in considerable economic benefit. For instance, such a method could be used to produce junction devices and detectors that are operable at higher temperatures than prior art devices, and could perhaps be employed in novel ways, e.g., to interconnect electronic circuits or chips. In particular, a method that can be used to produce superconductive oxide thin films economically and conveniently, without the use of expensive equipment such as vacuum chambers, would be of obvious benefit. Such a method is disclosed below.

SUMMARY OF THE INVENTION

We have discovered a convenient method of producing a layer of superconductive metal oxide on a substrate. The method comprises applying, by any appropriate technique (e.g., spraying, dipping, spin-on) a metal-containing precursor solution to the substrate such that a substantially homogeneous metal-containing layer is formed on the substrate. The method further comprises heat treating the layer such that unwanted constituents of the solution that are still present in the layer are removed from the layer, such that the appropriate superconductive phase is formed in the layer material, and such that, at completion of the heat treatment, the layer material has the appropriate degree of oxidation and is essentially free of chemical constituents that adversely affect ("poison") the superconductive oxide.

Whereas the inventive method is broadly applicable to forming superconductive oxide layers, currently preferred embodiments relate to forming cuprate layers. A currently preferred class of cuprates (to be referred to as the Ba-cuprates) can be represented by the generalized nominal formula $Ba_2M_{1-y}X_{x+y}Cu_3O_{9-\delta}$, where M is one of Y, Eu, or La, and X is one or more optional element different from Ba and M and selected from the elements of atomic number 57–71, Sc, Ca, and St. Typically $x+y$ is in the range 0–1 (with Ba and M being at least 50 atomic % unsubstituted), and $1.5 < \delta < 2.5$. This class of cuprates will be referred to as the Ba-cuprates. For examples of Ba-cuprates see, for instance, D. W.

Murphy et al, *Physical Review Letters*, Vol. 58(18) pp. 1888–1890. In a particular subclass of the Ba-cuprates, $0 \leq x < 0.2$ and $0 \leq y < 0.1$, with M being one or more of Ca, Sr, Y, La, Eu, Lu, and Sc.

Another known class of oxide superconductors has nominal composition $La_{2-x}M_xCuO_{4-\delta}$, where M is one or more of divalent metals such as Ba, Sr and Ca, $x \geq 0.05$, and $0 \leq \epsilon < 0.5$. This class will be referred to as the La-cuprates.

The inventive method is considered to be applicable to forming a layer of substantially any superconductive oxide on a substrate, including oxides containing alkali metal(s). Cuprates are currently thought to be the most promising class of oxides, and the inventive method can be used to produce unsubstituted cuprates as well as cuprates in which one or more other metals are substituted for part of the copper.

The metal-containing solution can be aqueous or nonaqueous. Typically, the metal ions in the solution are derived from salts or complexes (including metallo-organic complexes) such as carboxylates or acetylacetonates, or inorganic complexes such as nitrates, of the various metals [Cu, Ba, Y, Eu, etc.]), and the solvent advantageously has a relatively high solubility (typically such that a solution with more than 0.01 molar Cu concentration, preferably greater than 0.1, can be prepared) for the metal-containing compounds. Aqueous solutions frequently need to be acidic, e.g., contain a carboxylic acid or nitric acid. In an exemplary embodiment, the solvent (before concentration) is 1:1 $H_2O$ and acetic acid, and the metal salts are the metal acetates. In another exemplary embodiment the solvent is chloroform, toluene or other appropriate organic solvent, and the metal precursors are metallo-organic complexes of the relevant metals, for instance, carboxylate (e.g., butyrate or ethylhexanoate) complexes of the relevant metals. In general, the complexes of the different metals should be mutually compatible, the complexes should be soluble in a solvent that is suitable for spin-coating, spraying, or other application techniques, the solution should form homogeneous, continuous films, and the solution should decompose cleanly, e.g., leave no residual carbon.

The solution is applied to the substrate by any appropriate technique. The solution may be hot relative to the substrate or vice versa. For instance, in one embodiment the aqueous solution is at about 100° C. and the substrate is substantially at room temperature. In another embodiment the substrate is relatively hot, and the relatively cold solution is applied by spraying. In other embodiments the solution and the substrate are at substantially the same temperature, e.g., room temperature. The substrate frequently has a relatively plane surface to which the solution is applied, but this is not a requirement. For instance, the substrate may be a filamentary body, or may have any other nonplanar shape. However, the substrate material (or, more precisely, the surface of the substrate) has to be compatible with the superconductive oxide, as will be discussed in detail below.

After formation of the substantially homogeneous metal-containing layer on the substrate, the substrate/layer combination is heat treated. One aspect of the heat treatment is the removal of unwanted constituents from the layer material. By this is meant the removal of those constituents that are not desired to be present in the superconductive layer material. The removal may comprise pyrolysis of some constituents (e.g., organic ions such as $CH_3COO^-$) and/or evaporation. Exemplarily, the removal of the unwanted constituents is attained by heating to a temperature in the range 250°–450° C., but removal at higher temperatures may be required for some films.

A further aspect of the heat treatment is the transformation of the layer material into the phase that is associated with superconductivity. Frequently, this requires the formation of microcrystals, since the as-deposited layer typically is amorphous, whereas a definite crystal structure is associated with the superconductive phase. For instance, in at least some Ba-cuprates the high temperature ($T_c > 77$ K.) superconductive phase has a quasi-perovskite structure. The formation of the superconductive phase typically requires heating of the layer to a temperature in the range 600°–950° C., even as high as 1000° C.

At least in some embodiments of the invention the heat treatment conditions have an effect on the crystal orientation in the superconductive film. For instance, treating a film formed from metallo-organics at a relatively high temperature frequently favors the growth of crystallites with the c-axis normal to the film plane, whereas treating such a film at a relatively low temperature frequently favors random orientation of the crystallites. For films of nominal (final) composition $YBa_2Cu_3O_7$ the heat treatment typically comprises a soak (exemplarily in the range 1 minute to 5 hours) in an oxygen-containing atmosphere at a temperature in the approximate range 820°–1000° C., with c-axis orientation typically favored for soak temperatures of about 950° C. and above.

A third aspect of the heat treatment is the incorporation of oxygen into the layer material. It is known that at least some of the oxides of interest herein (e.g., at least some Ba-cuprates) lose oxygen at relatively high temperatures, and can take up oxygen from the ambient at intermediate temperatures. Therefore, the layer material typically is oxygen deficient at the completion of the above referred to transformation step, and the layer is advantageously maintained in an $O_2$-containing atmosphere at an intermediate temperature (typically in the range 300°–500° C.) for a time sufficient to result in the attainment of the desired oxygen concentration in the layer material. Slow cooling through the relevant temperature range of course can also accomplish this objective.

The superconductive oxides of interest herein frequently have a bulk superconductive transition temperature $T_c > 77$ K. Recently there have also been reports that indications of superconductivity have been detected in a Ba-cuprate at temperatures above 200 K., as high as 240 K. Some workers have even expressed a belief that a room temperature oxide superconductor will soon be discovered. Since the inventive method is broadly applicable to superconductive oxides, we contemplate its use in conjunction with superconductive oxides having bulk $T_c > 200$ K., 240 K., or even room temperature, should such oxides be found. Superconductive layers produced by the inventive method typically have a transition onset temperature of at least 77 K. and possibly even greater than about 240 K.

Thin superconductive layers according to the invention can advantageously be used in a variety of apparatus. For instance, they can be patterned by photolithographic and other methods so as to provide interconnects between electronic components or subsystems, or to form detectors or devices such as SQUIDS and other weak link devices. They can, for instance, also be deposited on a filamentary substrate so as to produce a relatively flexible superconductive "wire".

Apparatus comprising a superconductive layer according to the invention typically comprises electrical current source means and means responsive to an electrical current, both connected to the superconductive layer.

The inventive method can, economically and without the use of expensive equipment, produce large area thin layers of superconductive oxide material. It is expected that these characteristics of the novel method will assist in finding widespread use for the novel superconductive oxides.

DETAILED DESCRIPTION OF SOME EMBODIMENTS

Figure 1:
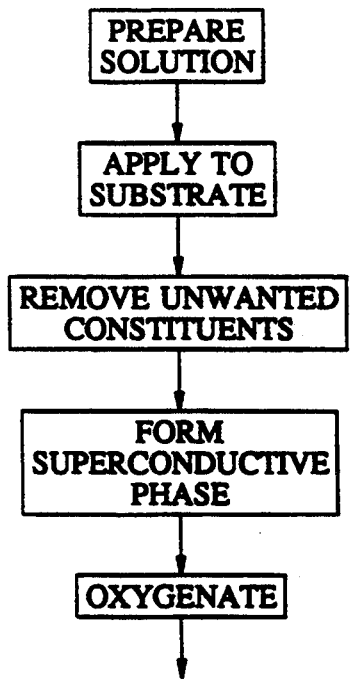
FIG. 1 is a flow chart showing major steps of a process according to the invention.

FIG. 1 schematically presents some process steps of an exemplary embodiment of the inventive process which will now be discussed in more detail. The solution is prepared by dissolving appropriate amounts of metal-containing compounds (e.g., metal acetates such as copper-, barium-, and yttrium acetate) in a solvent such as 1:1 glacial acetic acid and water at approximately 100° C. As will be appreciated by those skilled in the art, the amounts of the metal-containing compounds are chosen such that the metal ions are present in the solution in the desired molar ratios. This need not necessarily be the same molar ratio that is considered to be optimal in the corresponding bulk superconductive oxide. In one particular embodiment the solution is maintained at about 100° C. and allowed to evaporate until the Cu concentration in the solution is about 0.3 molar. The (hot) solution is then applied to a compatible substrate (e.g., a MgO wafer) by a standard technique (e.g., spin-on), resulting in the formation of a homogeneous (exemplarily transparent and glassy) layer on the substrate.

In another exemplary embodiment, stoichiometric amounts of metallo-organic complexes (e.g., ethylhexanoates such as those of Y, Ba, and Cu) are dissolved in chloroform at room temperature, and the resulting metal-containing solution is spin-coated at room temperature onto a $ZrO_2$ substrate, resulting in formation of a homogeneous layer on the substrate.

The substrate/layer combination is then heated so as to remove unwanted constituents (e.g., $H_2O$, acetic acid, $CO_2$). It is generally advantageous (although not obligatory) to raise the layer temperature slowly (e.g., 10°–50° C./hour) so as to avoid damage to the film. Typically the removal can be accomplished at temperatures up to about 450° C., although in some cases a higher temperature may be advantageously used. The removal step may be carded out in air, in any other appropriate atmosphere, or in a vacuum. Frequently, some oxidation of the layer material takes place during this step. The details of the removal step generally will depend on the nature of the unwanted constituents. Completion of the step can be verified by any appropriate technique, e.g., thermogravimetric or mass spectrographic analysis.

Transformation of the layer material into the superconductive phase typically requires heating of the layer material to a relatively high temperature for a period of time effective to result in transformation of at least a substantial portion (preferably essentially complete transformation) of the layer material. The degree of transformation can be monitored by any appropriate technique, e.g., X-ray diffraction or polarized light microscopy, as well as by determination of the superconductive properties, as will be apparent to those skilled in the art. The time required to complete the transformation depends strongly on the temperature, with lower temperatures corresponding to longer times. For various reasons (e.g., possible interaction of the layer material with the substrate) it may be desirable to carry out the transformation at a relatively low temperature, and/or to limit the time at the highest temperature. This may, for instance, be achieved by a multistep process (in which part of the transformation is carded out at one or more lower temperatures), or by means of flash heating (of all or part) of the layer. Such flash heating can be carded out with, for instance, a high intensity lamp or a laser. The transformation step is advantageously carded out in an oxygen-containing atmosphere (e.g., air, $O_2$ at ambient or elevated pressure) so as to limit the loss of oxygen from the layer material.

Subsequent to the transformation treatment it will frequently be advantageous to subject the layer material to an oxygenation treatment, since the oxygen concentration in the as-transformed layer material typically is lower than is optimal in the bulk material of equivalent composition. Oxygenation can be accomplished, for instance, by maintaining the layer in contact with an appropriate oxygen-containing atmosphere (e.g., air, $O_2$ at ambient or higher pressure) at an appropriate intermediate temperature (e.g., 400° C.) until the desired oxygen concentration is reached.

The above described processing steps are exemplary only, and other heat treatment schedules may also be advantageously used. For instance, the previously referred to film formed by a metallo-organic spin-on process can be heat treated by ramping the temperature to about 950°–1000° C. in 1–5 hours, soaking the film at a temperature in that range for about 1–10 minutes, ramping the temperature to about 400°–450° C. in about 0.5–2 hours, soaking at a temperature in that range for about 2–24 hours, followed by a furnace cool to about room temperature, all in an oxygen atmosphere.

As will be appreciated by those skilled in the art, the details of the above described process may frequently be optimized by observing the effect of changes of process parameters on the superconductive properties of the film. It may thus be possible that in some cases optimal operating conditions may be found outside of the typical ranges indicated herein.

It will also be appreciated that, since a single application of the inventive method typically results in a superconductive film of approximate thickness in the range 0.5–1 $\mu$m (the exact thickness typically depends on such factors as the metal concentration in the solution, the viscosity of the solution, and the application conditions such as the spinning rpm), it may at times be advantageous to apply a layer of metal-containing solution over an already formed superconductive layer, and to subject the combination to a further heat- and/or oxygenation treatment. Repeated application of the inventive technique thus can produce superconductive films of any desired thickness (typically less than about 5 $\mu$m) if this thickness cannot be obtained by a single application. Two or more applications of the inventive method may also result in improved critical current density of the resulting film since a film formed by a single application may comprise current-limiting cracks.

It has been found that the nature of the substrate has a significant effect on the properties of the layer on the substrate, and choice of a substrate that is compatible with a given superconductive layer material is a significant aspect of the inventive method. A "compatible" substrate herein is a substrate which does not substantially interact with the layer material during the heat treatment in a superconductivity-affecting manner. By way of example, some Ba-cuprate layers have been found to be substantially compatible with MgO substrates as well as $ZrO_2$ and $SrTiO_3$ substrates at many of the heat treatment conditions described herein, but were found to react to some degree (and are therefore not properly compatible) with $SiO_2$ substrates under the same conditions. $Al_2O_3$ has an intermediate degree of incompatibility and may be acceptable under some circumstances. These Ba-cuprate layers are also compatible with Au and Ag. Therefore, it may be possible to interpose an appropriate (Au or Ag, or one of the above compatible oxide) passivation layer (possibly together with one or more other layers that may serve different functions, e.g., prevent diffusion of Ag or Au into the substrate, or enhance adhesion) between a substrate and the superconductive layer thereon, to prevent poisoning of the layer material. Those skilled in the art will appreciate that under some conditions, e.g., flash heating, some substrates that are non-compatible with a given layer material under other heat treatment conditions (e.g., furnace heating) may have acceptable compatibility.

The above description of the method is exemplary only, and those skilled in the art will readily be able to determine the conditions that are advantageously used for a given substrate/superconductive layer combination.

Figure 2:
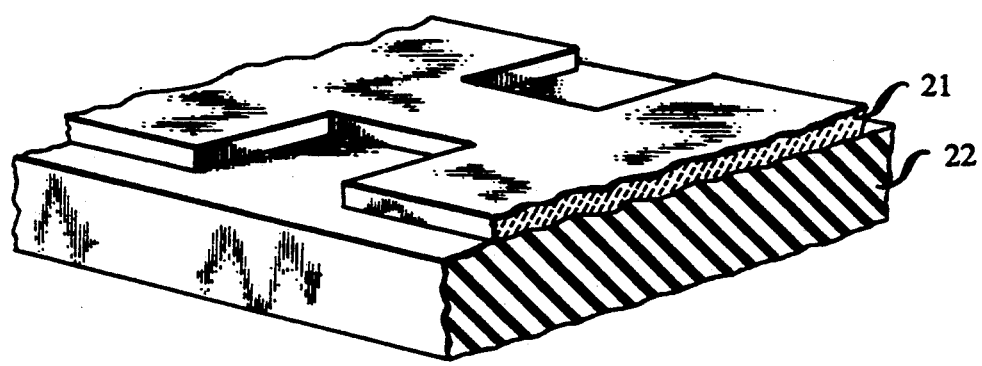
FIG. 2 schematically depicts a patterned inventive superconductive layer on a substrate.

FIG. 2 schematically depicts a (patterned) superconductive layer 22 on a substrate 21. Although not shown, a barrier layer (e.g., Au, Ag or MgO) can be interposed between 21 and 22. Patterning of 22 can be accomplished by any appropriate technique, e.g., photolithography in conjunction with wet or dry etching, laser ablation, or ion implantation.

EXAMPLE 1

A superconductive layer of nominal composition $Ba_2YCu_3O_7$ was prepared as follows: 0.9538 g of $BaCo_3$, 0.2729 g of $Y_2O_3$, and 0.8120 g of basic copper carbonate (which has been assayed and found to contain 56.74 weight % Cu) was added to 100 ml of 1:1 glacial acetic acid and $H_2O$. The mixture was refluxed for about 16 hours to give a clear blue solution, without visible residue. The solution was then boiled down to a volume of about 25 ml. After ascertaining that the solution was of proper concentration (by spinning hot solution onto room temperature quartz discs at 2000 rpm for 50 seconds; the concentration was deemed right if the spun on layers showed neither radial streaks nor were speckled but were even, pale blue films) the hot solution was spun under the same conditions onto 1 cm×1 cm×1 mm MgO crystal at room temperature. The substrate/layer combination was then heated in air from room temperature to 100° C. at 200° C./hour, and from 100° C. to 400° C. at 20° C./hour. The combination was then heated to 750° C. for 1 hour, to 800° C. for two hours, and 830° C. for 30 minutes, furnace cooled (about 30 minutes) to 400° C., held at 400° C. for 15 minutes, then cooled to room temperature (all of this in 1 at. of flowing $O_2$). The superconductive properties of the film were determined by measuring the resistance as a function of temperature by a standard 4-point probe technique. The layer was found to have a transition onset temperature of about 85 K.

EXAMPLE 2

A superconductive layer of nominal composition $Ba_2EuCu_3O_7$ was prepared substantially as described in Example 1, except that 0.4252 gm of $Eu_2O_3$ was substituted for $Y_2O_3$. The resulting layer was found to have a transition onset temperature of about 75 K.

EXAMPLE 3

A superconductive film of nominal composition $YBa_2Cu_3O_7$ was prepared as follows: $1.35 \times 10^{-3}$ mol Y(2-ethylhexanoate)$_3$ $2.7 \times 10^{-3}$ mol Ba(2-ethylhexanoate)$_2$, and $4.05 \times 10^{-3}$ mol Cu(2-ethylhexanoate)$_2$ were dissolved in 10.5 g (7 ml) chloroform at room temperature (the ethylhexanoates were prepared substantially as described by G. M. Vest et al in the *Materials Research Society Proceedings, Symposium L: Defect Properties and Properties of High-Technology Nonmetallic Materials*, Boston, Mass., Dec. 2–4, 1985, Y. Chen et at, editors, pp. 35–42). The resulting solution was spin-coated onto a MgO substrate (2000 rpm, 60 s), the coated substrate placed into a standard tube furnace, with oxygen flowing through the furnace tube, and the furnace temperature ramped up to about 990° C. in 2 hours. Next, the sample was soaked at 990° C. for 3 minutes, the furnace temperature was ramped down to about 450° C. in about 30 minutes, the sample soaked at 450° C. for 8 hours, followed by a furnace cool to room temperature. The resulting back ceramic film was about 0.5 μm thick, had predominantly c-axis orientation perpendicular to the film plane, an onset $T_c$ of about 89 K., with $T_c$ (R=0) of about 77 K.

EXAMPLE 4

A superconductive film having a thickness of about 1 μm was produced by forming a 0.5 μm thick film substantially as described in Example 3, spin-coating a layer of the metal-containing solution onto the film, and repeating the heat treatment. The resulting film had predominantly c-axis orientation and onset T of about 89 K.

EXAMPLE 5

A metal-containing solution was spun onto a MgO substrate substantially as described in Example 3. The coated substrate was placed into the tube furnace and, under $O_2$ at ambient pressure, the temperature was ramped to 850° C. for 1 hour and the sample was soaked at that temperature for 1 hour. The temperature was then ramped to 400° C. (30 minutes), nd the sample soaked at that temperature for 8 hours, followed by a furnace cool to room temperature. The thus produced 0.5 μm $YBa_2Cu_3O_{9-\delta}$ (δ about 2.1) film consisted or randomly oriented grains, and had an onset $T_c$ of about 91 K.

EXAMPLE 6

A superconductive film of nominal composition $NdBa_2Cu_3O_7$ was produced substantially as described in Example 4, except that Nd(2-ethylhexanoate)$_3$ was substituted for the Y(2-ethylhexanoate)$_3$. The resulting film has predominantly c-axis orientation normal to the film plane and onset T$_c$ of about 89 K.

EXAMPLE 7

A superconductive film of nominal composition YBa$_2$Cu$_3$O$_7$ was produced substantially as described in Example 4, except that Cu(isobutyrate)$_2$ is substituted for the Cu(2-ethylhexanoate)$_2$. The resulting film has essentially the same properties as the film of Example 4.

EXAMPLES 8-13

Superconductive films are formed substantially as described in Examples 1 and 4, respectively, except that the substrate is strontium titanate, Ag-coated (0.5 μm evaporated Ag) SiO$_2$, and Ag-coated oxidized Si, respectively.

EXAMPLE 14

A patterned superconductive film is formed by producing a film substantially as described in Example 4, followed by patterning by means of laser ablation.

EXAMPLE 15

A superconductive body is formed by coating a 0.5 mm diameter Ag wire with a metal-containing solution prepared substantially as described in Example 1, and by heat treating the coated wire, also as described in that example.

What is claimed is:

1. Method of producing a superconductive layer on a surface of a substrate CHARACTERIZED IN THAT the method comprises
    a) applying a metal ion-containing precursor solution to the surface of the substrate such that a substantially homogeneous layer results; and
    b) heating at least a part of the layer in the presence of oxygen such that at least a substantial portion of the material in the part of the layer is transformed into a metal oxide superconductive material; wherein the precursor solution is formed by dissolving metal ion-containing salts and/or complexes in an acidic aqueous medium, and wherein the metal ion content of the precursor solution and the conditions of b) are selected such that
    c) the metal oxide superconductive material has nominal composition Ba$_{2-x}$M$_{1-y}$X$_{x+y}$Cu$_3$O$_{9-\delta}$, where M is selected from the group consisting of Y, Eu, and La, X is an optional component different from Ba, Y, Eu and La and selected from the group consisting of the elements of atomic number 57-71, Sc, Ca, and Sr, with $0 \leq x+y \leq 1$, $1.5 < \delta < 2.5$, and Ba and M being at least 50% unsubstituted; and such that
    d) the superconductive layer has a transition onset temperature of at least 77 K.; wherein the acidic aqueous medium comprises a member selected from the group consisting of acetic acid, carboxylic acid, and nitric acid, wherein b) comprises maintaining the layer in the temperature range 250°-450° C. for a time effective for removal of substantially all constituents of the layer other than Cu,Ba, M, X and O, wherein b) further comprises maintaining the layer in an oxygen-containing atmosphere in the temperature range 600°-950° C. for a time effective for transformation of substantially all of the layer material into a superconducting phase; and wherein b) still further comprises maintaining the layer in an oxygen-containing atmosphere in the temperature range 300°-500° C. for a time effective for oxygenation of the layer material.

2. Method of claim 1, comprising selecting the substrate from the group consisting of MgO, ZrO$_2$, and SrTiO$_3$.

3. Method of claim 1, comprising providing a substrate that comprises a first substrate material and a barrier layer on at least part of the first substrate material, wherein the barrier layer consists substantially of material selected from the group consisting of Au, Ag, MgO, ZrO$_2$, and SrTiO$_3$.

4. Method of claim 1, comprising selecting a substrate that is a filamentary body.

5. Method of claim 1, wherein a) comprises spraying the precursor solution onto the surface, with the temperature of the substrate being substantially higher than the temperature of the precursor solution.

6. A method for producing a patterned rare earth alkaline earth copper oxide superconductive film on a substrate which comprises the steps of:
    a) preparing an aqueous solution of the nitrates of rare earth metal, alkaline earth metals and copper with a molar ratio for forming a desired oxide superconductor;
    b) spraying said aqueous solution onto the surface of the substrate such that a substantially homogeneous layer results; and
    c) heating preselected portions of said layer in the presence of oxygen for a time sufficient to convert the preselected portions into a patterned superconductive oxide film and to remove all constituents of the layer other than rare earth metal, alkaline earth metals, copper and oxygen.

7. A method for producing a patterned rare earth alkaline earth copper oxide superconductive film on a substrate which comprises the steps of
    a) preparing an aqueous solution of soluble salts of rare earth metal, alkaline earth metals, and copper with a molar ratio for forming a desired oxide superconductor;
    b) forming a substantially homogeneous layer of said aqueous solution on the substrate; and
    c) heating preselected portions of said layer in the presence of oxygen for a time sufficient to convert the preselected portions into a patterned superconductive oxide film and to remove essentially all chemical constituents that adversely affect the superconductive oxide.

* * * * *